United States Patent
Joo et al.

(10) Patent No.: US 9,051,513 B2
(45) Date of Patent: Jun. 9, 2015

(54) ORGANIC LIGHT EMITTING DEVICE

(75) Inventors: Won-jae Joo, Seongnam-si (KR); Hye-yeon Yang, Seoul (KR); Jhun-mo Son, Yongin-si (KR); Ho-suk Kang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 145 days.

(21) Appl. No.: 12/955,135

(22) Filed: Nov. 29, 2010

(65) Prior Publication Data

US 2011/0127509 A1 Jun. 2, 2011

(30) Foreign Application Priority Data

Nov. 30, 2009 (KR) .................. 10-2009-0117093

(51) Int. Cl.
| | | |
|---|---|---|
| H01L 51/54 | (2006.01) | |
| C09K 11/02 | (2006.01) | |
| C09K 11/06 | (2006.01) | |
| H01L 51/00 | (2006.01) | |
| H01L 51/50 | (2006.01) | |
| H05B 33/14 | (2006.01) | |
| H05B 33/20 | (2006.01) | |

(52) U.S. Cl.
CPC .............. C09K 11/02 (2013.01); C09K 11/06 (2013.01); *C09K 2211/1029* (2013.01); *C09K 2211/1475* (2013.01); *C09K 2211/185* (2013.01); *H01L 51/0039* (2013.01); *H01L 51/0043* (2013.01); *H01L 51/5012* (2013.01); H05B 33/14 (2013.01); H05B 33/20 (2013.01)

(58) Field of Classification Search
None
See application file for complete search history.

(56) References Cited

U.S. PATENT DOCUMENTS

| | | | |
|---|---|---|---|
| 7,563,519 | B2 | 7/2009 | Thompson et al. |
| 2003/0214246 | A1* | 11/2003 | Yamazaki .................. 315/169.3 |
| 2005/0073245 | A1* | 4/2005 | Gong et al. .................... 313/502 |
| 2007/0152573 | A1* | 7/2007 | Kim et al. ...................... 313/506 |
| 2008/0061681 | A1* | 3/2008 | Thompson et al. ........... 313/504 |
| 2008/0269491 | A1* | 10/2008 | Jabbour et al. .................... 546/4 |

FOREIGN PATENT DOCUMENTS

| | | |
|---|---|---|
| JP | 2007-318130 | 6/2007 |
| KR | 1020080088307 | 10/2008 |
| KR | 1020090097363 A | 9/2009 |
| WO | 2009063833 | 5/2009 |

OTHER PUBLICATIONS

Korean Office Action dated Mar. 10, 2015, of Korean Patent Application No. 10-2009-0117093 with English Translation.

* cited by examiner

*Primary Examiner* — J. L. Yang
(74) *Attorney, Agent, or Firm* — Cantor Colburn LLP

(57) ABSTRACT

An organic light emitting device (OLED) includes a polymeric fluorescent light emitting material doped with a phosphorescent dopant to form a fluorescent light emitting layer. The fluorescent light emitting layer may inhibit or prevent device degradation without affecting light emission from the light emitting layer, and may improve the service life of the OLED.

11 Claims, 3 Drawing Sheets

ORGANIC LIGHT EMITTING DEVICE

CROSS-REFERENCE TO RELATED APPLICATIONS

This application claims priority to Korean Patent Application No. 10-2009-0117093, filed on Nov. 30, 2009, and all the benefits accruing therefrom under 35 U.S.C. 119, the content of which in its entirety is herein incorporated by reference.

BACKGROUND

1. Field

The present disclosure relates to an organic light emitting device ("OLED"), and more particularly, to an OLED having a longer service life by inhibiting or preventing device degradation without affecting the light emitting efficiency of a light emitting layer.

2. Description of the Related Art

An organic light emitting device (OLED) is a light emitting device that operates by the phenomenon in which light is generated when electrons and holes combine in an organic light emitting layer when a current or a voltage is applied to the organic light emitting layer. OLEDs have numerous and varied applications in devices such as full-color display devices, backlight units for liquid crystal displays ("LCD"), information display devices, vehicle display devices, lighting devices, and other such devices. Recently, polymer OLEDs have been made which incorporate polymers as carrier transporting and light emitting materials instead of small molecules. Such a polymer OLED may be fabricated by a wet process, thereby reducing material costs and simplifying fabrication processes.

The OLED can operate at a low voltage, shows high-luminance surface emission, has very fast response, and may be fabricated in a slim package. In addition, OLEDs have excellent color reproduction and a wide viewing angle, and may easily change emitted light colors by selection of appropriate fluorescent or phosphorescent materials.

The operating voltage of such OLEDs tends to continually increase during operation, and this increase in the operating voltage is recognized as a cause for reducing the service life of the OLED. The increase in the operating voltage of the OLED translates to increased internal resistance of the OLED, the cause of which may be attributed to the degradation of the interface between layers or of the material itself in each layer. Therefore, in order to improve the service life of the OLED, such causes of increased resistance in OLEDs have to be negated or compensated for.

SUMMARY

Thus, in an embodiment, an organic light emitting device (OLED) includes: a substrate; an anode formed on a surface of the substrate; a fluorescent polymer light emitting layer formed on a surface of the anode and including a fluorescent light emitting material and a phosphorescent dopant emitting in the infrared portion of the spectrum; and a cathode formed on a surface of the fluorescent polymer light emitting layer.

The phosphorescent dopant in the OLED may have an emission amount (i.e., may emit an amount of infrared radiation) of equal to or less than about 1/10 of an emission amount of the fluorescent light emitting material.

The fluorescent polymer light emitting layer may be doped with the phosphorescent dopant in an amount of about 0.1 to about 3.0 wt % based on the total weight of the fluorescent light emitting material.

In an embodiment, the fluorescent light emitting material is a blue light emitting material and the phosphorescent dopant may be a material having a peak emission wavelength greater than about 650 nm.

In an embodiment, the fluorescent light emitting material is a green light emitting material and the phosphorescent dopant may be a material having a peak emission wavelength greater than about 770 nm.

In an embodiment, the fluorescent light emitting material is a red light emitting material and the phosphorescent dopant may be a material having a peak emission wavelength greater than about 1,000 nm.

The OLED may further include an intermediate layer formed between opposing surfaces of the anode and the fluorescent light emitting layer.

The intermediate layer may include a hole injection layer or a hole transport layer.

BRIEF DESCRIPTION OF THE DRAWINGS

These and/or other embodiments will become apparent and more readily appreciated from the following description of the embodiments, taken in conjunction with the accompanying drawings of which.

DESCRIPTION OF REFERENCE NUMERALS IN MAIN PARTS OF DRAWINGS

Figure 1:
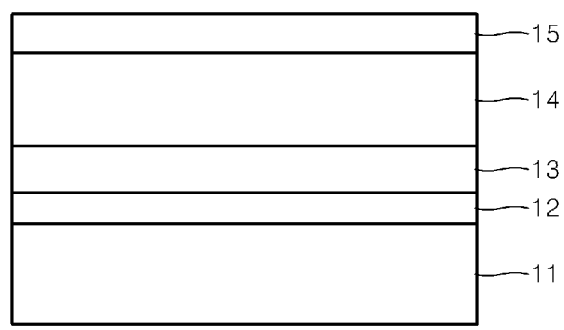
FIG. 1 is a cross-sectional view schematically illustrating an OLED, according to an embodiment.

| 11 | Substrate | 12 | Anode |
| --- | --- | --- | --- |
| 13 | Intermediate layer | 14 | Light emitting layer |
| 15 | Cathode | | |

DETAILED DESCRIPTION

Hereinafter, an Organic Light Emitting Device (OLED) according to an embodiment will be described in detail with reference to the accompanying drawings. In the figures, like reference numerals refer to like elements, and the size or thickness of respective elements may be exaggerated for the clarity of description.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view schematically illustrating an OLED according to an embodiment of the inventive concept.

Referring to FIG. 1, the OLED according to an embodiment includes a substrate 11, an anode 12 disposed on a surface of the substrate 11, an intermediate layer 13 disposed on a surface of the anode 12, a light emitting layer 14 disposed on a surface of the intermediate layer 13, and a cathode 15 disposed on a surface of the emitting layer 14, which are sequentially formed on the substrate 11 in the order stated. Herein, the light emitting layer 14 may be formed as a structure including a fluorescent polymer material and a phosphorescent dopant.

The substrate 11 is not limited to any particular type or composition of substrate provided it is one that is generally used for OLEDs. For example, a transparent substrate may be used, such as a glass substrate, a plastic substrate or the like. The anode 12, for example, may be formed of a transparent conductive material such as Indium-Tin-Oxide ("ITO"), Indium-Zinc-Oxide ("IZO"), $SnO_2$, $ZnO_2$, or the like.

The intermediate layer 13 may be selected from a Hole Injection Layer ("HIL"), a Hole Transport Layer ("HTL"), an interlayer, or the like, or a combination of these. An HIL, where used, may include for example phthalocyanine compounds such as copper phthalocyanine or the like, 4,4',4"-tris(N-(3-methylphenyl)-N-phenylamino) tri(N-phenyl)amine ("m-MTDATA"), N,N'-di(1-naphtyl)-N,N'-diphenylbenzidine ("NPB"), 4,4',4"-tris(N,N-diphenylamino) triphenylamine ("TDATA"), 4,4',4"-tris(N-(2-naphthyl)-N-phenylamino)-triphenylamine ("2T-NATA"), Polyaniline/Dodecylbenzenesulfonic acid ("PANI/DBSA"), Poly(3,4-ethylenedioxythiophene)/Poly(4-styrenesulfonate) ("PEDOT/PSS"), Polyaniline/Camphorsulfonic acid ("PANI/CSA") and Polyaniline/Poly(4-styrenesulfonate) ("PANI/PSS") or the like, but the materials are not limited thereto. An exemplary HIL material may be PEDOT/PSS in which PEDOT (poly(3,4-ethylenedioxythiophene)) is doped with PSS (poly(4-styrenesulfonate)). The hole injection layer 120 may be formed to a thickness of about 100 to about 1,000 Å, preferably about 300 to about 1,000 Å.

The HTL, may, for example, be formed of a known hole transport material including carbazole derivatives such as N-phenylcarbazole, polyvinylcarbazole, or the like; amine derivatives having aromatic fused rings such as N,N'-bis(3-methylphenyl)-N,N'-diphenyl-[1,1-biphenyl]-4,4'-diamine ("TPD"), N,N'-di(naphthalene-1-yl)-N,N'-diphenylbenzidine ("α-NPD") or the like; triphenylamine-based substances such as 4,4',4"-tris(N-carbazolyl)triphenylamine ("TCTA") or the like; or a combination comprising at least one of these. The hole transport layer may be formed to a thickness of about 50 to about 1,000 Å, preferably about 100 to about 600 Å.

The cathode 15 may be formed of, for example, metals such as aluminum (Al), silver (Ag), magnesium (Mg), lithium (Li), calcium (Ca), barium (Ba), or the like, or of alloys thereof.

A hole blocking layer ("HBL") or an electron transport layer ("ETL") or the like may be further included between opposing surfaces of the light emitting layer 14 and the cathode 15. The hole blocking material may be formed from, for example, an oxadiazole derivative, a triazole derivative, a phenanthroline derivative, 4,4'-N,N'-dicarbazole-biphenyl ("BCP"), and the like. The hole blocking layer may be formed to a thickness of about 50 to about 1,000 Å, preferably about 100 to about 300 Å. The electron transport layer serves to stably transport electrons from an electron donor electrode (a cathode) and may be a known material such as, for example, a quinoline derivative, in particular, tris(8-hydroxyquinolinato) aluminum ("Alq3"), 3-(4-Biphenylyl)-4-phenyl-5-(4-tert-butylphenyl)-1,2,4-triazole ("TAZ"), or bis(2-methyl-8-quinolinolato)-aluminum biphenolate ("Balq"). The electron transport layer may be formed to a thickness of about 100 to about 1,000 Å, preferably about 200 to about 500 Å.

The light emitting layer 14 comprises a composition formed of a light emitting material doped with a phosphorescent dopant. The light emitting material may be a fluorescent light emitting material such as those generally used in OLEDs. For example, the fluorescent light emitting material may be a polymeric blue light emitting material such as a copolymer of a tetraalkoxy-substituted spiro-bisfluorene and an N-aryl-substituted phenoxazine, a green light emitting material such as poly[2-methoxy-5-(2'-ethyl-hexyloxy)-1,4-phenylene vinylene], or a red light emitting material such as cyano-polyphenylene vinylene.

The phosphorescent dopant is a substance which emits radiation in the infrared portion of the spectrum (or in other words, emits at a wavelength higher than that of the red portion of the spectrum at about 650 nm), and may have a peak emission wavelength within the infrared spectrum. For example, the phosphorescent dopant may be selected from Pt-tetraphenyltetrabenzoporphyrin with a peak emission wavelength of about 770 nm, Pt-tetraphenyltetranaphtho[2,3]porphyrin with a peak emission wavelength of about 890 nm and Ir-Bis(1-pyrenyl-iso-quinolone) acetyl acetonate with a peak emission wavelength of about 720 nm, but the inventive concept is not limited thereto. The light emitting layer 14 may be doped with the phosphorescent dopant in an amount of about 0.1 to about 3.0 wt %, specifically about 0.5 to about 2.5 wt %, based on the total weight of the light emitting material.

Operation of the exemplary OLED having a light emitting layer doped with the phosphorescent dopant will now be described. Referring to FIG. 1, when current is applied to the anode 12 and cathode 15, holes and electrons generated respectively from the anode 12 and cathode 15 are transferred to the light emitting layer 14. The transferred holes and electrons then recombine in the light emitting layer 14, thereby generating excitons. The excitons so generated undergo a radiative decay in which light is emitted with a wavelength corresponding to the band gap of the light emitting material. At this time, the excitons are divided into singlet excitons and triplet excitons, in a statistical ratio of about 1:3. Only singlet excitons (about 25% of the total excitons generated) interact in the fluorescent light emitting material. The singlet excitons transit very rapidly, at a time of about $10^{-12}$ sec, and emit light, but the triplet excitons transit relatively slowly to a ground state over a time period of about $10^{-6}$ to about $10^{-3}$ sec.

Because it is statistically difficult for an excited molecule in the triplet level to contribute to the transfer of the electrons/holes or the generation of the excitons during the operation of the OLED, reduction in both current and luminous efficiency may be induced. Where the light emitting material is doped with a phosphorescent dopant, a transition occurs from the triplet level accumulating in the light emitting material to the triplet level of the phosphorescent dopant such that the phenomenon of triplet accumulation in the fluorescent material may be alleviated. The quantity of the phosphorescent dopant in the light emitting layer is limited to about 0.1 to about 3.0 wt % with respect to the total weight of the light emitting material for the following reasons. Where the amount of the phosphorescent dopant is below about 0.1 wt %, the attenuation effect of the excitons accumulating in the triplet level during operation is small. In contrast, where the amount of the phosphorescent dopant is greater than about 3.0 wt %, the amount of transition from the excitons formed in the singlet of the fluorescent light emitting material to the singlet excitons of the phosphorescent dopant increase such that the fluorescent light emission efficiency is significantly decreased. Therefore, a suitable phosphorescent dopant level is from about 0.1 to about 3.0 wt % and may be determined from the transition rates between the singlet and the triplet states of fluorescent molecules and the ones of phosphorescent molecules which strongly depend on molecules' characteristics.

For a fluorescent light emitting material, the singlet state energy and triplet state energy of the blue light emitting material are about 2.7 eV and about 1.9 eV, respectively, and these energies in the case of the green light emitting material are about 2.4 eV and about 1.6 eV, respectively. For the red light emitting material, these energies are about 2.0 eV and about 1.3 eV, respectively. The blue light emitting material is doped with the phosphorescent dopant having a peak emission wavelength greater than about 650 nm, and the green light emitting material is doped with the phosphorescent dopant having a peak emission wavelength greater than about 770 nm. In the case of the red light emitting material, the phosphorescent dopant having a peak emission wavelength greater than about 1,000 nm may be used. The triplet energies discussed above for the blue, green, and red fluorescent molecules are examples which may be estimated by the artisan skilled in the OLED art.

In an exemplary embodiment, colors are implemented using emission wavelength of the light emitting material instead of using an emission of the phosphorescent dopant, for an emission wavelength of the light emitting layer 14. An emission by the phosphorescent dopant may be equal to or less than about 1/10 of the fluorescent light emission amount. The light emitting layer 14 may be doped with the phosphorescent dopant in the range of about 0.1 to about 3.0 wt % with respect to the total weight of the light emitting material. If fluorescent light emitting layer is host-guest composition such as a polyfluorene-based host and coumarin 6 green dopant, the range of 0.1 to 3.0 wt % is based on the total weight of the host and guest molecules.

Fabrication Example

An anode is formed by vapor deposition of ITO on a glass substrate, and a hole injection layer having a thickness of about 50 nm is formed on a surface of the anode. The hole injection layer is formed by casting a film of PEDOT/PSS (CLEVIOS™ P VP Al4083, from H. C. Starck) having a thickness of 50 nm and is subsequently heat treated at about 200° C. for about 5 minutes. A light emitting layer having a thickness of 70 nm is formed by spin casting a solution (1 wt % in chlorobenzene), of a blue polymer material having a peak emission wavelength of about 480 nm, which is doped with Iridium(III)Bis(2-(9,9-dibutylfluorenyl)-1-isoquinolone(acetylacetonate) as a red phosphorescent dopant in the quantity of about 0.6 wt % of the polymer material. After casting the light emission layer was baked on a hot plate at 100° C. for 1 hour under nitrogen. The blue polymer material is a copolymer of a tetraalkoxy-substituted spiro-bisfluorene and an N-aryl-substituted phenoxazine (fluorene:phenoxazine 9:1 molar ratio) and is represented by the following Formula:

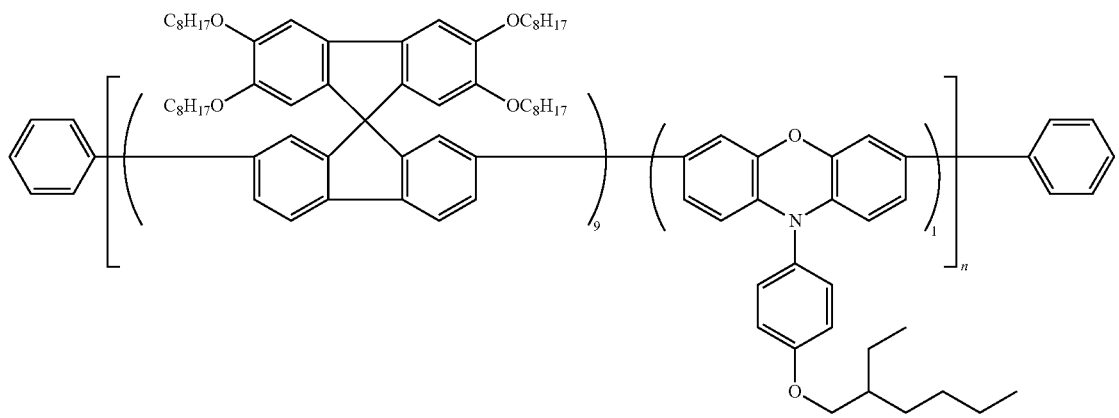

where n is 1 to about 20 or higher.

Then, a cathode is disposed on a surface of the light emitting layer by vacuum evaporation of a Ba/Al alloy to complete the fabrication of the OLED.

Figure 2:
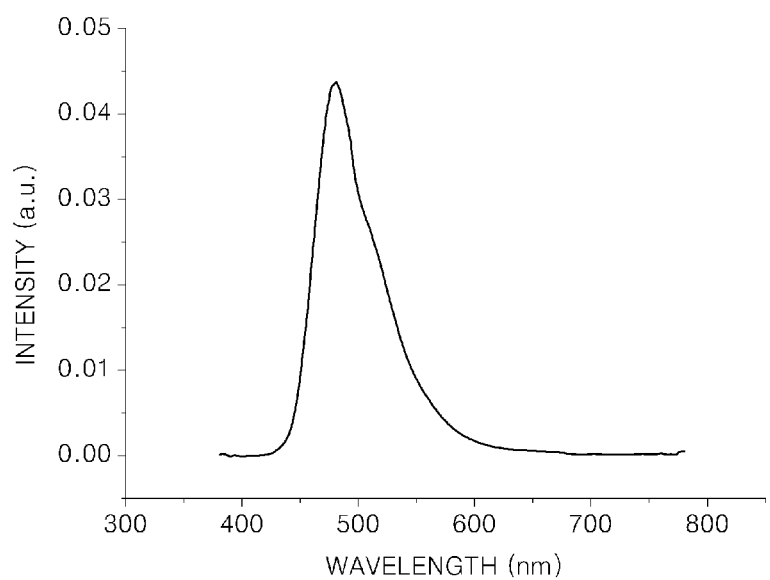
FIG. 2 is a luminescence spectrum of an OLED, having a light emitting layer formed by doping a blue fluorescent material with a phosphorescent dopant having a peak emission wavelength of about 650 nm.

The luminescent properties are then determined for the OLED. FIG. 2 is a spectrum of luminescence (in absorbance units) for the OLED (i.e., a blue fluorescent light emitting device) fabricated in accordance with the foregoing descriptions, in which a light emitting layer is formed by doping a blue fluorescent material with a phosphorescent dopant having a peak emission wavelength of about 650 nm.

Referring to FIG. 2, the peak emission wavelength can be seen to be about 480 nm, and the emission from the phosphorescent dopant having a peak emission wavelength of about 650 nm is not observed.

Figure 3:
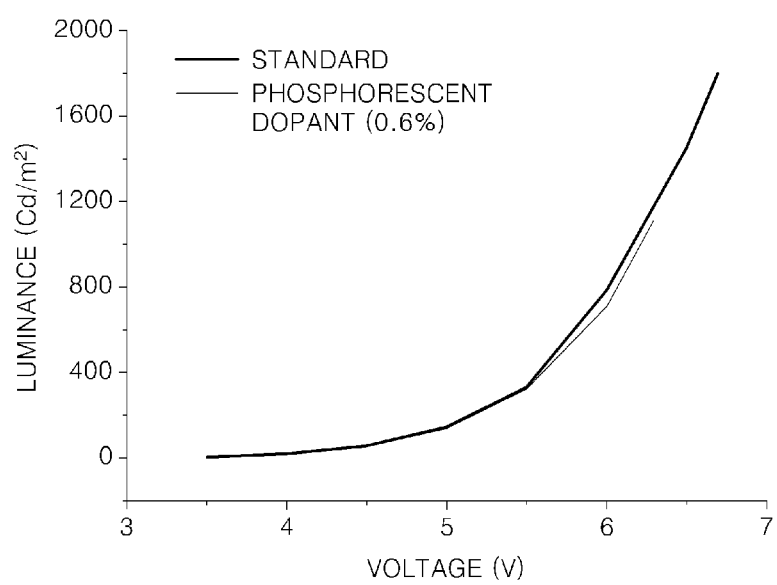
FIG. 3 is a plot of luminescence characteristics as a function of operating voltages in OLEDs doped with a phosphorescent dopant ("phosphorescent dopant") and without a phosphorescent dopant ("standard") in a light emitting layer.

FIG. 3 is a comparison plot of luminance (reported in candles per square meter, $Cd/m^2$) as a function of operating voltages for OLEDs with a phosphorescent dopant (phosphorescent dopant) and without a phosphorescent dopant (standard) prepared by the same method above but without the dopant, in a light emitting layer.

Referring to FIG. 3, it can be seen that there is little difference in the luminescence characteristics between the OLEDs with a phosphorescent dopant (phosphorescent dopant) and without a phosphorescent dopant (standard), as seen in the nearly overlapping lines, with only a slight increase in voltage needed above about 300 Cd/m² for the doped OLED to achieve comparable luminance with the undoped OLED.

Figure 4:
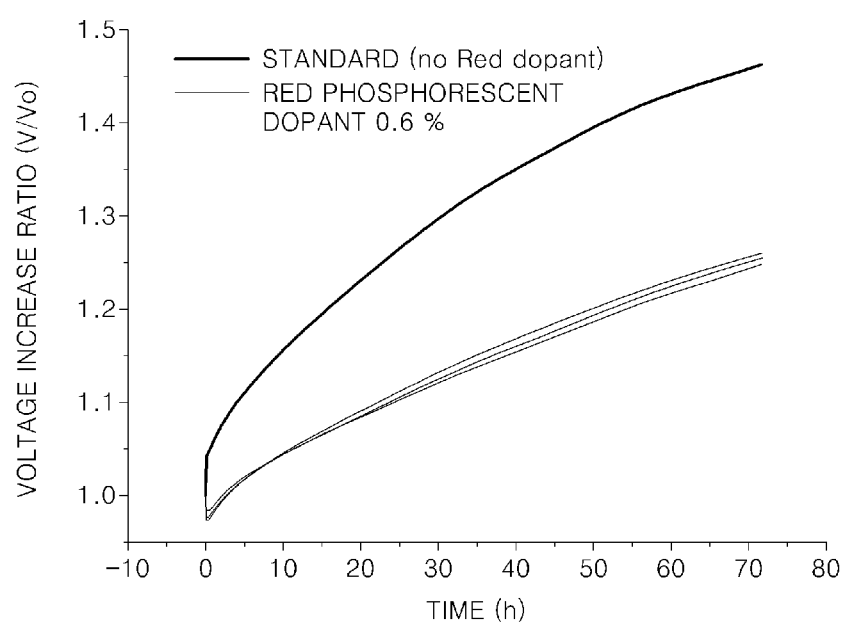
FIG. 4 is a plot of operating voltage change as a function of time in the OLEDs with a phosphorescent dopant ("phosphorescent dopant") and without a phosphorescent dopant ("standard") in a light emitting layer.

FIG. 4 is a plot of operating voltage change (voltage increase ratio, V/Vo) as a function of time in the OLEDs with a red phosphorescent dopant (phosphorescent dopant) and without a phosphorescent dopant (standard) in a light emitting layer.

Referring to FIG. 4, where the phosphorescent dopant is not included, the operating voltage increases by about 45% after about 70 hours with respect to the initial voltage ($V_0$). In contrast, the operating voltage increases by about 25% after about 70 hours with respect to the initial voltage ($V_0$) where the phosphorescent dopant is used. The rate of increase in the operating voltage directly affects the service life of an OLED. Since a large increase in the operating voltage means severe device degradation, device degradation is reduced in the case including the phosphorescent dopant, thereby increasing the service life of the OLED.

As described above, according to the one or more of the above embodiments, device degradation is inhibited or prevented by doping the light emitting material with a phosphorescent dopant in the light emitting layer of the OLED. Therefore, the OLED with increased service life may be implemented without affecting the light emitting efficiency of the light emitting layer.

It should be understood that the exemplary embodiments described herein are descriptive only and are not intended to be limiting. Descriptions of features or aspects within each embodiment should typically be considered as available for other similar features or aspects in other embodiments.

What is claimed is:

1. An organic light emitting device comprising:
    a substrate;
    an anode formed on a surface of the substrate;
    a fluorescent polymer light emitting layer formed on a surface of the anode and comprising a fluorescent visible light emitting material and a phosphorescent dopant emitting in the infrared portion of the spectrum, the phosphorescent dopant being selected from Pt-tetraphenyltetrabenzoporphyrin, and Pt-tetraphenyltetranaphtho[2,3]porphyrin; and
    a cathode formed on a surface of the fluorescent polymer light emitting layer,
    wherein the fluorescent polymer light emitting layer is doped with the phosphorescent dopant in a range of about 0.1 to about 3.0 wt % with respect to a total weight of the fluorescent light emitting material,
    wherein, when the organic light emitting device is operated, an emission amount of the phosphorescent dopant is equal to or less than 1/10 of an emission amount of the fluorescent visible light emitting material.

2. The OLED of claim 1, wherein the fluorescent visible light emitting material is a blue light emitting material and the phosphorescent dopant is a material having a peak emission wavelength greater than about 650 nm.

3. The OLED of claim 1, wherein the phosphorescent dopant is a material having a peak emission wavelength of about 770 nm.

4. The OLED of claim 1, wherein the phosphorescent dopant is a material having a peak emission wavelength of about 890 nm.

5. The OLED of claim 1, further comprising an intermediate layer formed between opposing surfaces of the anode and the fluorescent light emitting layer.

6. The OLED of claim 5, wherein the intermediate layer comprises a hole injection layer or a hole transport layer.

7. A composition comprising:
    a polymeric fluorescent visible light emitting material and a phosphorescent dopant emitting in the infrared portion of the spectrum; the phosphorescent dopant being selected from Pt-tetraphenyltetrabenzoporphyrin, and Pt-tetraphenyltetranaphtho[2,3]porphyrin,
    wherein the composition is doped with the phosphorescent dopant in an amount of about 0.1 to about 3.0 wt % based on the total weight of the fluorescent visible light emitting material, and
    wherein, when operated in an organic light emitting device, an emission amount of the phosphorescent dopant is equal to or less than 1/10 of an emission amount of the fluorescent light emitting material.

8. The OLED of claim 7, wherein the fluorescent visible light emitting material is a blue light emitting material and the phosphorescent dopant is a material having a peak emission wavelength greater than about 650 nm.

9. The OLED of claim 7, wherein the phosphorescent dopant is a material having a peak emission wavelength of about 770 nm.

10. The OLED of claim 7, wherein the phosphorescent dopant is a material having a peak emission wavelength of about 890 nm.

11. A fluorescent polymer light emitting layer comprising the composition of claim 7.

* * * * *